(12) United States Patent
Peng et al.

(10) Patent No.: US 7,902,803 B2
(45) Date of Patent: Mar. 8, 2011

(54) DIGITAL CURRENT MODE CONTROLLER

(75) Inventors: Hao Peng, San Jose, CA (US); Dragan Maksimovic, Boulder, CO (US)

(73) Assignee: The Regents of the University of Colorado, Denver, CO (US)

( * ) Notice: Subject to any disclaimer, the term of this patent is extended or adjusted under 35 U.S.C. 154(b) by 448 days.

(21) Appl. No.: 11/967,981

(22) Filed: Dec. 31, 2007

(65) Prior Publication Data

US 2008/0164859 A1 Jul. 10, 2008

Related U.S. Application Data

(63) Continuation-in-part of application No. 11/369,888, filed on Mar. 6, 2006, now Pat. No. 7,315,270.

(60) Provisional application No. 60/658,768, filed on Mar. 4, 2005.

(51) Int. Cl.
*G05F 1/00* (2006.01)

(52) U.S. Cl. ...................................................... 323/283

(58) Field of Classification Search .................. 323/318, 323/241, 271, 282, 283, 284, 285, 322
See application file for complete search history.

(56) References Cited

U.S. PATENT DOCUMENTS

| | | | | |
|---|---|---|---|---|
| 4,471,340 A * | 9/1984 | Lewis | ............................ | 341/157 |
| 6,407,536 B1 * | 6/2002 | Ogusa | ............................ | 323/207 |
| 6,849,834 B2 * | 2/2005 | Smolenski et al. | ........... | 219/501 |
| 2006/0043954 A1 * | 3/2006 | Markowski | ................... | 323/283 |
| 2008/0169796 A1 * | 7/2008 | Buethker et al. | ............. | 323/282 |

FOREIGN PATENT DOCUMENTS

WO 2003050637 A3 6/2003

OTHER PUBLICATIONS

Maksimovic, Dragan, et al., "Impact of Digital Control in Power Electronics," International Symposium on Power Semiconductor Devices & ICs, 2004, pp. 13-22.
Patella, Benjamin J., et al., "High-Frequency digital PWM controller IC for DC-DC converters," IEEE Transactions on Power Electronics, vol. 18, No. 1, Jan. 2003, pp. 438-446.
Peterchev, Angel V., et al., "Architecture and IC Implementation of a Digital VRM Controller," IEEE Transactions on Power Electronics, vol. 18, No. 1, Jan. 2003, pp. 356-364.
Chen, Jingquan, et al., "Predictive Digital Current Programmed Control," IEEE Transactions on Power Electronics, vol. 18, No. 1, Jan. 2003, pp. 411-419.

(Continued)

*Primary Examiner* — Bao Q Vu
*Assistant Examiner* — Nguyen Tran
(74) *Attorney, Agent, or Firm* — Hamilton, DeSanctis & Cha LLP; Thomas J. Osborne, Jr.

(57) ABSTRACT

A digital current-mode controller for a DC-DC converter is disclosed. The controller comprises a digital current reference; and a current loop compensator adapted to receive a digital current error signal derived from a digital current sample sensed from the DC-DC converter and the digital current reference and to generate a duty-cycle command, wherein the current loop compensator comprises a low-pass filter that is used in generating the duty-cycle command. A DC-DC regulator comprising a digital current-mode controller and a method of controlling a DC-DC converter are also disclosed.

22 Claims, 10 Drawing Sheets

OTHER PUBLICATIONS

Bibian, Stephane, et al., "High Performance Predictive Dead-Beat Digital Controller for DC Power Supplies," IEEE, 2001, pp. 67-73.

Bibian, Stephane, et al., "Digital Control with Improved Performance for Boost Power Factor Correction Circuits," IEEE, 2001, pp. 137-143.

Sprock, Doug, et al., "Predictive Discrete Time Control of Switchmode Applications," IEEE, 1997, pp. 175-181.

Koga, Takashi, et al., "Dead Beat Control for PWM Inverter," IEEE, 1994, pp. 549-554.

Peterchev, Angel V., et al., "Quantization Resolution and Limit Cycling in Digitally Controlled PWM Converters," IEEE Transactions on Power Electronics, vol. 18, No. 1, Jan. 2003, pp. 301-308.

Peng, Hao, et al., "Modeling of Quantization Effects in Digitally Controlled DC-DC Converters," IEEE Power Electronics Specialists Conference, 2004, pp. 4312-4318.

Peng, Hao, et al., "Digital Current-Mode Controller for DC-DC Converters," IEEE, 2005, pp. 899-905.

Peng, Hao, et al., "Digital Current Mode Controller for DC-DC-Converters," APEC Feb. 11, 2005, pp. 1-21.

Vincent, Michael, "Design and Implementation of a Self-Calibrated, Delay-Line Analog-to-Digital Converter,"M.S. Thesis, University of Colorado, Boulder, 2002, pp. 1-128.

Syed, Asif, et al., "Digital PWM Controller with Feed-Forward Compensation," Colorado Power Electronics Center, ECE Department, University of Colorado, Boulder, pp. 1-7.

Yousefzadeh, Vahid, et al., "Sensorless Optimization of Dead Times in DC-DC Converters with Synchronous Rectifiers," Colorado Power Electronics Center, ECE Department, University of Colorado, Boulder, pp. 1-7.

* cited by examiner

DIGITAL CURRENT MODE CONTROLLER

CROSS-REFERENCE TO RELATED APPLICATIONS

This application claims the benefit of U.S. provisional application No. 60/658,768, filed Mar. 4, 2005, which is hereby incorporated by reference as though fully set forth herein.

This application is a continuation-in-part of U.S. application Ser. No. 11/369,888, filed Mar. 6, 2006, now pending (the '888 application), which also claims the benefit of and incorporates in its entirety by reference U.S. provisional application No. 60/658,768, filed Mar. 4, 2005 (the '768 application). The '888 application and the '768 application are both hereby incorporated by reference in their entirety including any material incorporated by reference therein as though fully set forth herein.

BACKGROUND a. Field of the Invention

The instant invention relates to digital current mode controllers. In particular, the instant invention relates to digital current mode controllers for DC-DC converters.

b. Background Art

Practical high-frequency voltage-mode digital pulse-width-modulator (PWM) controllers have been demonstrated. In analog realizations, current-mode control is often used because of relatively simpler over-load protection and paralleling features, as well as robust dynamic responses under various operating conditions.

Related results in this area include predictive control algorithms, and digital signal processor (DSP) based controller implementations in DC-DC, AC-DC, and DC-AC applications. These approaches have relied on relatively high-resolution current A/D converters and more complex processing, which may not be attractive for mainstream high-frequency low-to-medium power DC-DC applications where a small-size, low-cost controller would be the most practical solution. Furthermore, quantization effects in the combined current and voltage loops have not been addressed so far.

BRIEF SUMMARY

A digital average current-mode controller architecture based on a current analog-to-digital (A/D) converter and a digital controller is provided. In one embodiment, for example, the digital average current-mode controller architecture may be implemented via a low-resolution current A/D converter and a simple digital controller. Advantages of such embodiments include practical digital realization of current-mode control for DC-DC converters operating at high switching frequencies.

In one implementation, for example, a digital current-mode controller for a DC-DC converter is provided. The digital current-mode controller comprises a digital current reference; and a current loop compensator adapted to receive a digital current error signal derived from a digital current sample sensed from the DC-DC converter and the digital current reference, and to generate a duty-cycle command. The current loop compensator comprises a low-pass filter that is used in generating the duty-cycle command.

In another implementation, a switched-mode DC-DC regulator is provided. The DC-DC regulator comprises a switched-mode DC-DC converter comprising an input voltage terminal and an output voltage terminal, the switched-mode DC-DC converter comprising a switch; a current analog-to-digital converter adapted to provide a digital sensed current value corresponding to an analog current value in the DC-DC converter; a digital current reference; and a current loop compensator adapted to receive a digital current error signal derived from the digital sensed current value and the digital current reference, and to generate a duty-cycle command. The current loop compensator comprises a low-pass filter that is used in generating the duty-cycle command.

In yet another implementation, a method of generating a duty-cycle command for a DC-DC converter is provided. The method comprises receiving a digital current reference; receiving a digital current sample sensed from the DC-DC converter; generating a digital current error signal derived from the digital current reference and the digital current sample; and providing a current compensator to generate a duty-cycle command using a low-pass filter.

The foregoing and other aspects, features, details, utilities, and advantages of the present invention will be apparent from reading the following description and claims, and from reviewing the accompanying drawings.

DETAILED DESCRIPTION OF THE INVENTION

Switched-Mode DC-DC Converter with a Digital Current Mode Controller

Figure 1:
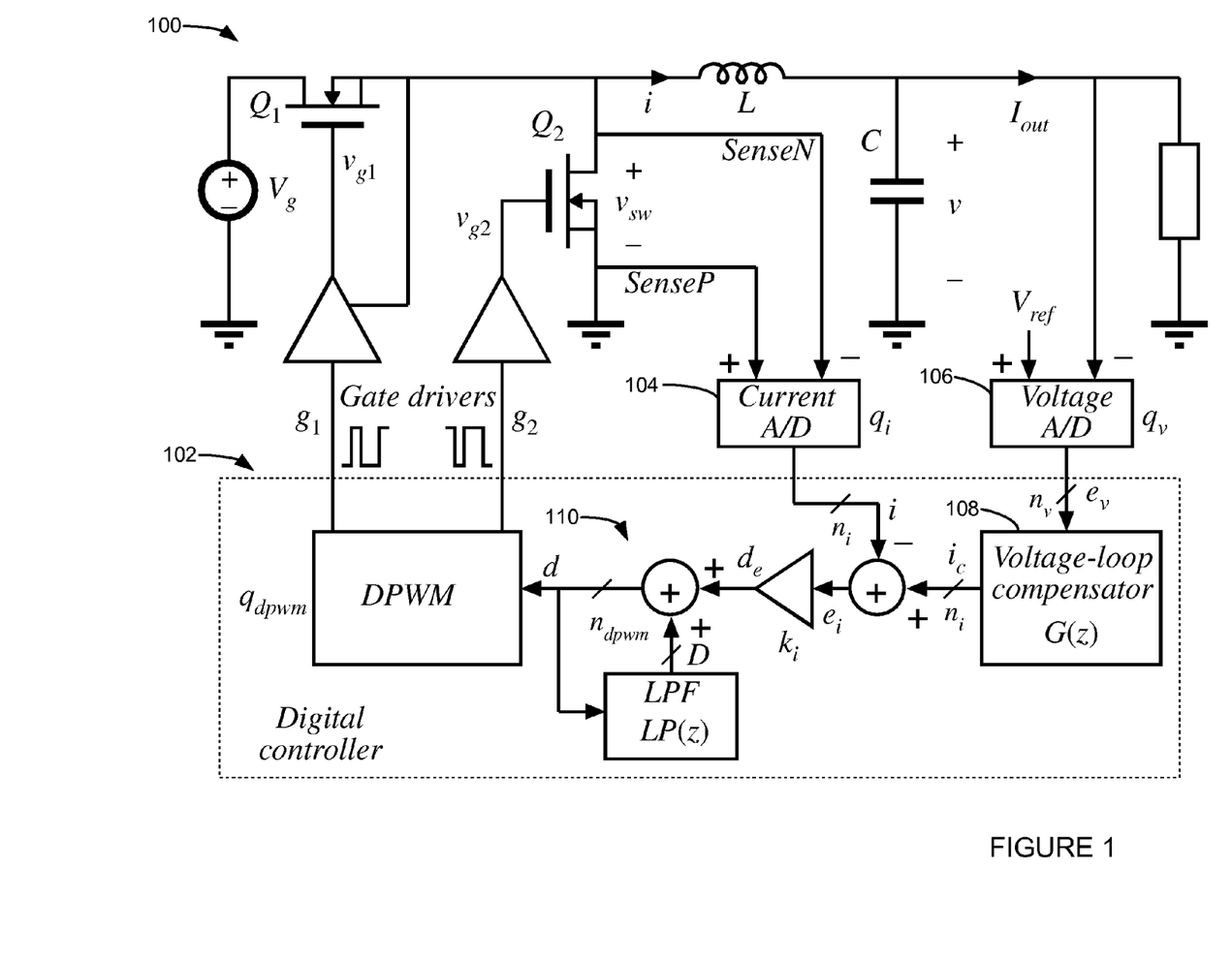
FIG. 1 shows an example implementation of a switched-mode DC-DC voltage regulator having a digital current mode controller.

A solution that has the potentials of combining advantages of digital control and current-mode controller in a relatively simple controller realization based on a low-resolution current A/D converter is provided. One implementation of a controller architecture is shown in FIG. 1. FIG. 1 shows a switched-mode DC-DC converter 100, a controller 102, a current A/D converter 104, and a voltage A/D converter 106.

The architecture comprises a two-loop approach. The output voltage is sensed and compared to a voltage reference to determine an error signal $e_v$ via the voltage A/D converter

106. The error signal is converted to a digital voltage reference signal $e_i$. A voltage-loop compensator 108 computes a digital current reference signal $i_c$. A digital representation of the inductor current i is obtained by sensing the voltage across a synchronous rectifier $Q_2$ using the current A/D converter 106. The architecture provides a low-resolution current A/D converter in which both the current reference $i_c$ and the sensed current i can be represented with relatively few bits ($n_i$). A low-resolution current error signal $e_i$ derived from the current reference $i_c$ and the sensed current i is input to a current-loop compensator 110 where a low-pass filter LP(z) generates a steady-state duty-cycle command D with high resolution necessary for precise output voltage regulation.

A duty cycle command d is provided to a digital pulse-width-modulator (DPWM) to provide at least one gate drive signal g for driving at least one switch of the switched-mode DC-DC converter 100. In the particular implementation shown in FIG. 1, for example, the DPWM generates two gate drive signals $g_1$ and $g_2$ that are applied to switches $Q_1$ and $Q_2$ of the switched-mode DC-DC converter 100.

In the particular implementation shown in FIG. 1, for example, a switched-mode DC-DC converter comprises a synchronous buck DC-DC converter. Other DC-DC converters, such as a boost, buck-boost, SEPIC, Cuk, transformer-isolated DC-DC converters such as flyback or forward, may also be used.

Figure 2:
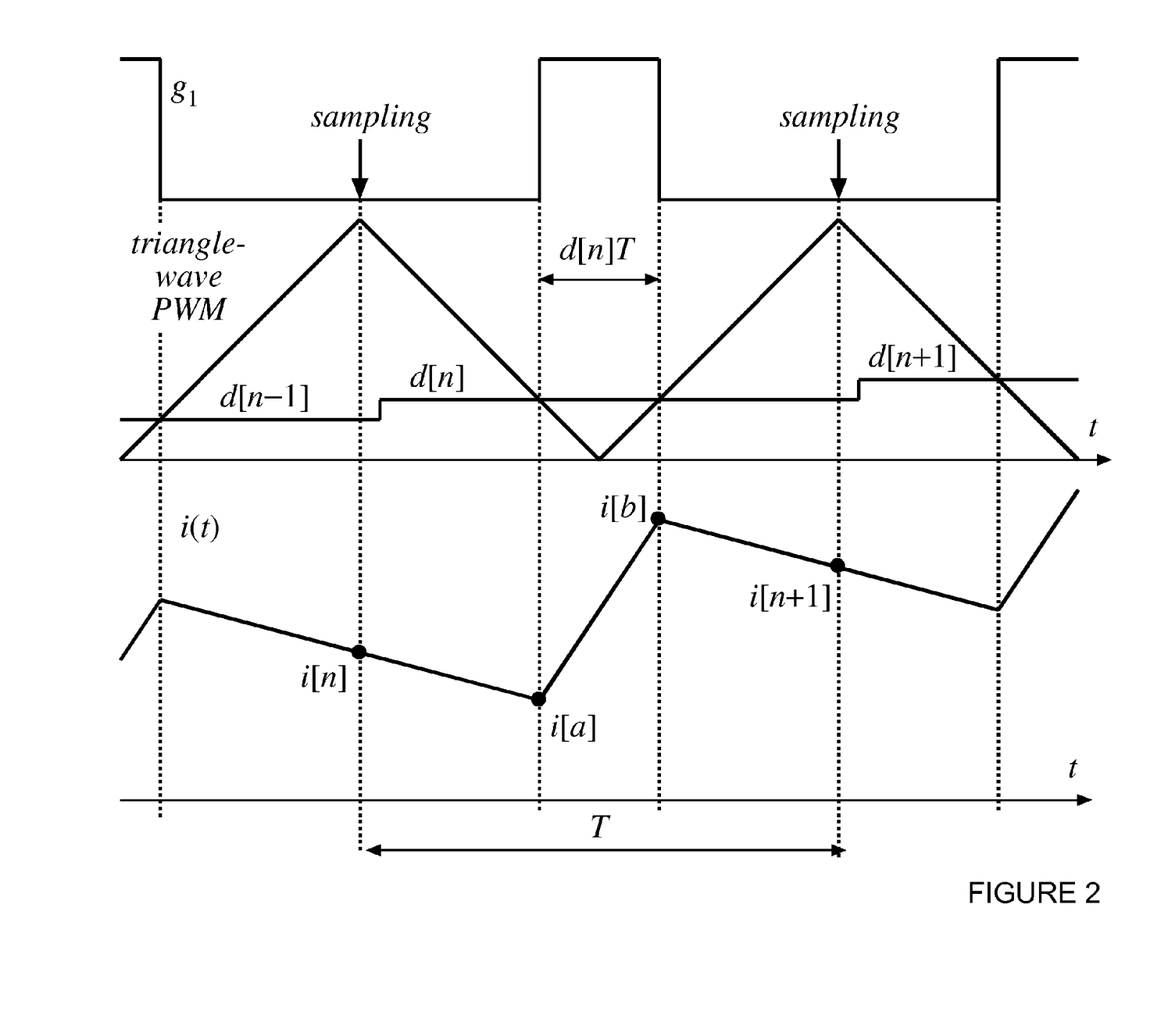
FIG. 2 illustrates waveforms showing how a triangle-wave pulse-width-modulator (PWM) can be used to sample a current signal from a DC-DC converter.

FIG. 2 illustrates waveforms showing how a triangle-wave PWM can be used to sample a current signal in the middle of a switch on-time (or in the middle of a switch off-time), which is advantageous for noise immunity. In the controller shown in FIG. 1, for example, current is sensed by sampling a voltage across the synchronous rectifier in the middle of a (1−d)T interval, where T is the switching period and d is the main switch duty cycle. Although triangle-wave PWM is shown, other modulation techniques, such as leading edge or trailing edge modulation may also be used.

The waveforms shown in FIG. 2 can be used to understand derivation of a discrete-time model of a power stage. Assuming that the output voltage v remains approximately constant during a switching period, v≈V, the inductor current slopes are approximately constant, $(V_g-V)/L$ during a dT interval, and $-V/L$ during (1−d)T interval. As a result, from FIG. 2, the inductor current dynamics are the following:

$$i[n+1] = i[n] - \frac{VT}{L} + \frac{V_g T d[n]}{L} \quad (3)$$

The average inductor current during this period is:

$$\langle i \rangle = \frac{i[n] + i[a]}{2} \frac{1 - d[n]}{2} + \frac{i[a] + i[b]}{2} d[n] + \quad (4)$$
$$\frac{i[b] + i[n+1]}{2} \frac{1 - d[n]}{2}$$
$$= i[n] - \frac{VT}{2L} + \frac{V_g T d[n]}{2L}$$

The output voltage change in the same period is:

$$v[n+1] - v[n] = \frac{T}{C}\left(\langle i \rangle - \frac{V}{R}\right) \quad (5)$$

Using V=v(n), and combining formulas (4) and (5), the following can be derived:

$$v[n+1] = \left(1 - \frac{T^2}{2LC} - \frac{T}{CR}\right)v[n] + \frac{T}{C}i[n] + \frac{V_g T^2}{2LC}d[n] \quad (6)$$

From formulas (3) and (6), a discrete-time state space model for the power stage can be represented as the following:

$$\begin{bmatrix} i[n+1] \\ v[n+1] \end{bmatrix} = \begin{bmatrix} 1 & -\frac{T}{L} \\ \frac{T}{C} & 1 - \frac{T}{RC} - \frac{T^2}{2LC} \end{bmatrix} \begin{bmatrix} i[n] \\ v[n] \end{bmatrix} + \begin{bmatrix} \frac{V_g T}{L} \\ \frac{V_g T^2}{2LC} \end{bmatrix} d[n]. \quad (7)$$

The Z-transform of formula (7) yields the control-to-inductor current and control to output transfer functions:

$$\begin{bmatrix} i(z) \\ v(z) \end{bmatrix} = \frac{\begin{bmatrix} \left(z - 1 + \frac{T}{RC}\right)\frac{V_g T}{L} \\ (z+1)\frac{V_g T^2}{2LC} \end{bmatrix}}{z^2 + \left(\frac{T}{RC} + \frac{T^2}{2LC} - 2\right)z + 1 - \frac{T}{RC} + \frac{T^2}{2LC}} d(z) \quad (8)$$

The current control objective is to let the sampled inductor current match the current reference with one cycle delay, $$i[n+1]=i_c[n], \quad (9)$$

which, using formula (3), gives the following current control law:

$$d[n] = \frac{L}{TV_g}(i_c - i[n]) + \frac{V}{V_g} \approx k_i(i_c - i[n]) + D, \quad (10)$$

where $k_i$ is a current compensator gain. The voltage ratio $V/V_g$ in formula (10) can be approximated by the steady-state duty-cycle command D, which can be computed without sensing any power stage signals simply by low-pass filtering the cycle-by-cycle duty-cycle command d, as shown in the controller architecture shown in FIG. 1. Applying the Z-transform to formula (9) provides the following:

$$i(z)=i_c(z)z^{-1}, \quad (10a)$$

which when combined with formula (8) provides a control-to-output transfer function for the voltage loop:

$$G_{vc}(z) = \frac{v(z)}{i_c(z)} = \frac{v(z)}{i(z)} \frac{i(z)}{i_c(z)} = \frac{T}{2C} \frac{z+1}{z\left(z - 1 + \frac{T}{RC}\right)}. \quad (11)$$

This control-to-output transfer function allows a design of a voltage loop compensator G(z) using standard feedback techniques. In the embodiment of FIG. 1, the voltage loop compensator G(z) can be, for example, a proportional-integral (PI) or a proportional-integral-derivative (PID) compensator.

A/D Converter for Current Sensing

Figure 3:
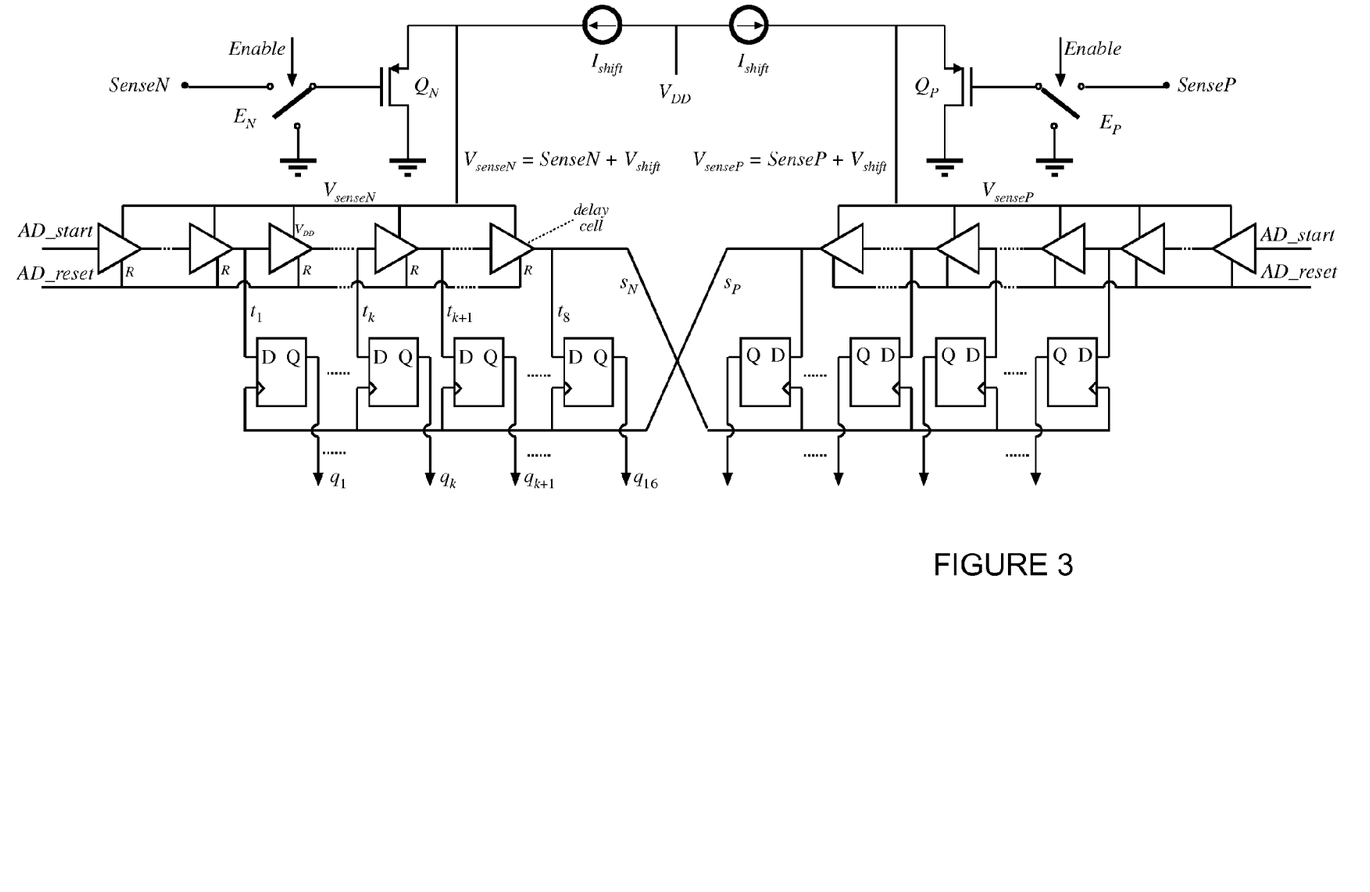
FIG. 3 shows a differential delay line analog-to-digital (A/D) converter configuration as one possible current A/D converter that may be used in the controller shown in FIG. 1.

FIG. 3 shows an A/D converter configuration used as a current A/D in the controller shown in FIG. 1. This differential-delay line configuration is an extension of pending U.S. patent application Ser. No. 11/369,888, entitled "Differential delay-line analog-to-digital converter and filed Mar. 6, 2006, which is hereby incorporated by reference in its entirety. A conversion starts by propagating a pulse AD_Start simultaneously through two logic delay lines supplied from $V_{senseP}$ and $V_{senseN}$, respectively. Since the propagation delay of a logic gate is approximately inversely proportional to the supply voltage, the length of propagation along the delay line is a measure of the supply voltage. At the end of the conversion time $T_c$, the strobe signal ($s_P$ or $s_N$) generated at the output of one delay line is used to latch the signal propagation status on the other line. As a result, the outputs $q_1$-$q_{16}$ are a digital representation (in thermometer code) of the error signal $V_{senseP}$-$V_{senseN}$, which is, through the level shifting devices $Q_N$ and $Q_P$, equal to the voltage drop $R_{ON}i$=$Sense_P$-$Sense_N$ across the synchronous rectifier. The pulse AD_Start, which starts the conversion, is generated in the middle of the $Q_2$ turn-on time, in order to sample the current approximately equal to the average inductor current, as discussed above. The Enable signal gates the sense nodes to the A/D converter inputs during the time the synchronous rectifier $Q_2$ is on.

Figure 4:
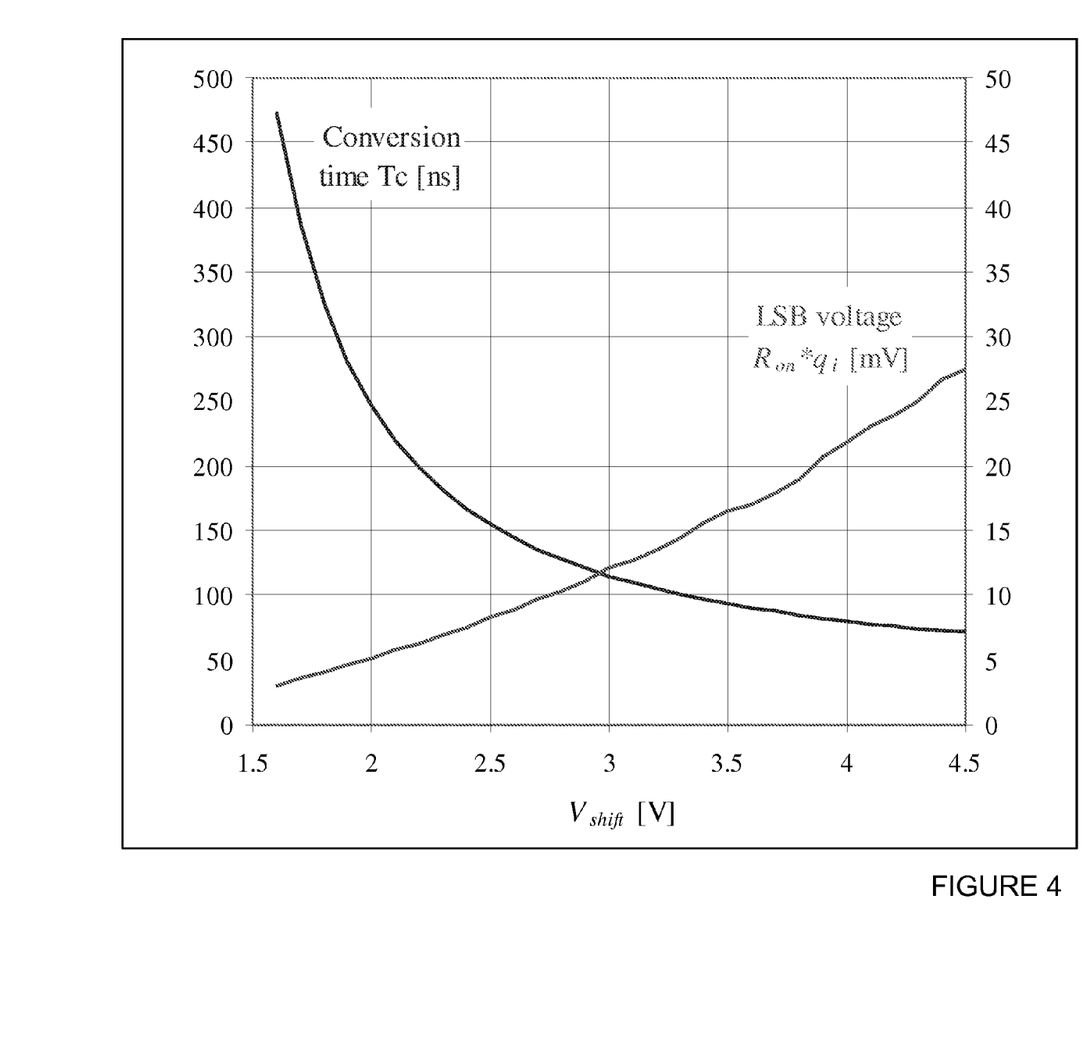
FIG. 4 shows how the level-shifting voltage $V_{shift}$ can be used to trade off the conversion time $T_c$ for the voltage LSB (least significant bit) resolution $R_{on}q_i$ of the A/D converter.
Figure 5:
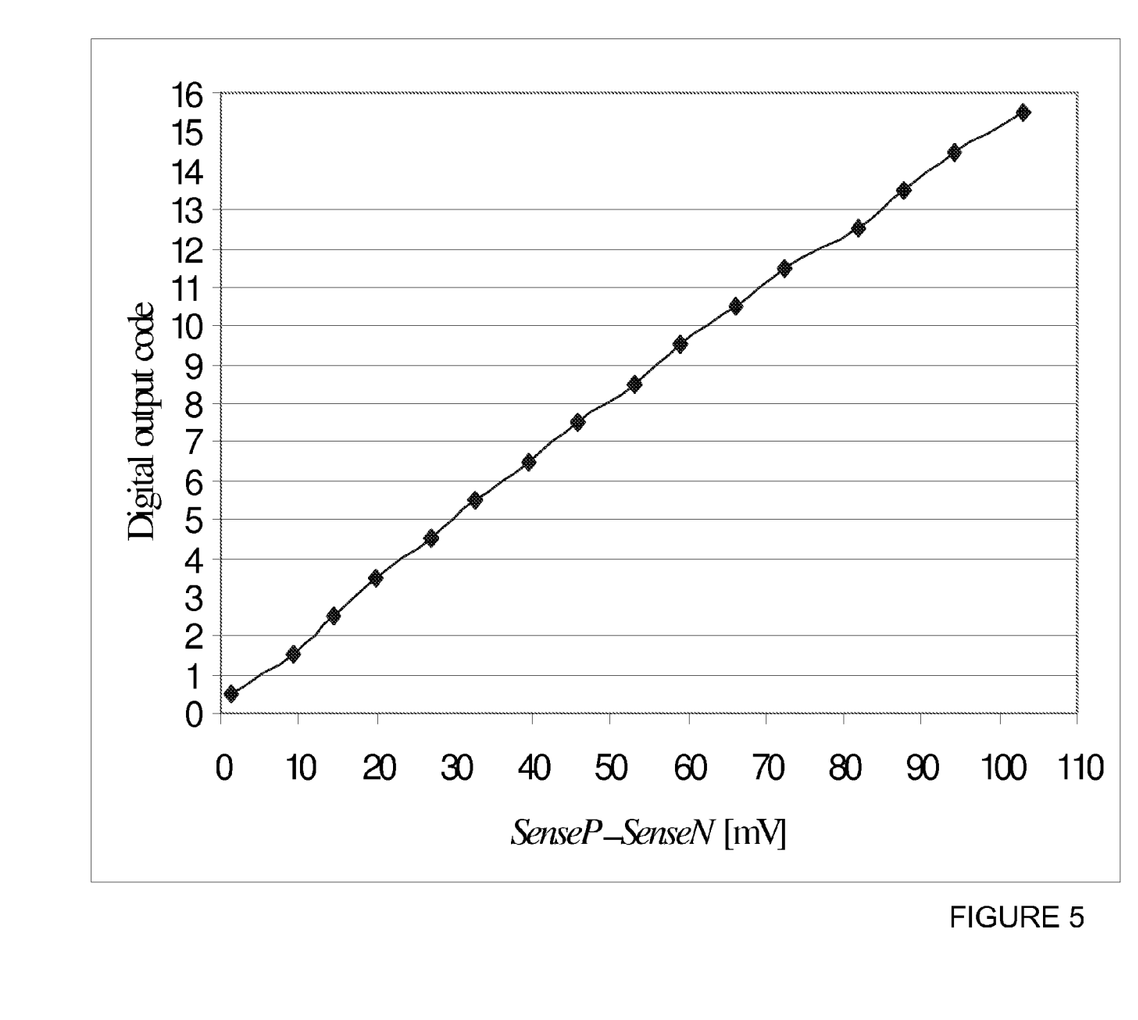
FIG. 5 shows experimentally measured static characteristics for one implementation of an A/D converter.

In one implementation, an A/D converter has been implemented on a test prototype IC in 0.8μ CMOS. FIG. 4 shows how the level-shifting voltage $V_{shift}$, which can be adjusted by changing the current source $I_{shift}$, can be used to trade off the conversion time $T_c$ for the voltage LSB (least significant bit) resolution $R_{on}q_i$ of the A/D converter, where $q_i$ is the current LSB resolution in amps. For example, $V_{shift}$=2 V gives the conversion time $T_c$=250 ns, and $R_{on}q_i$=5 mV. For a synchronous rectifier with $R_{on}$=5 mΩ, this provides a current LSB quantization of $q_i$=1 A. The experimentally measured static characteristic shown in FIG. 5 closely verifies the design values.

Figure 6:
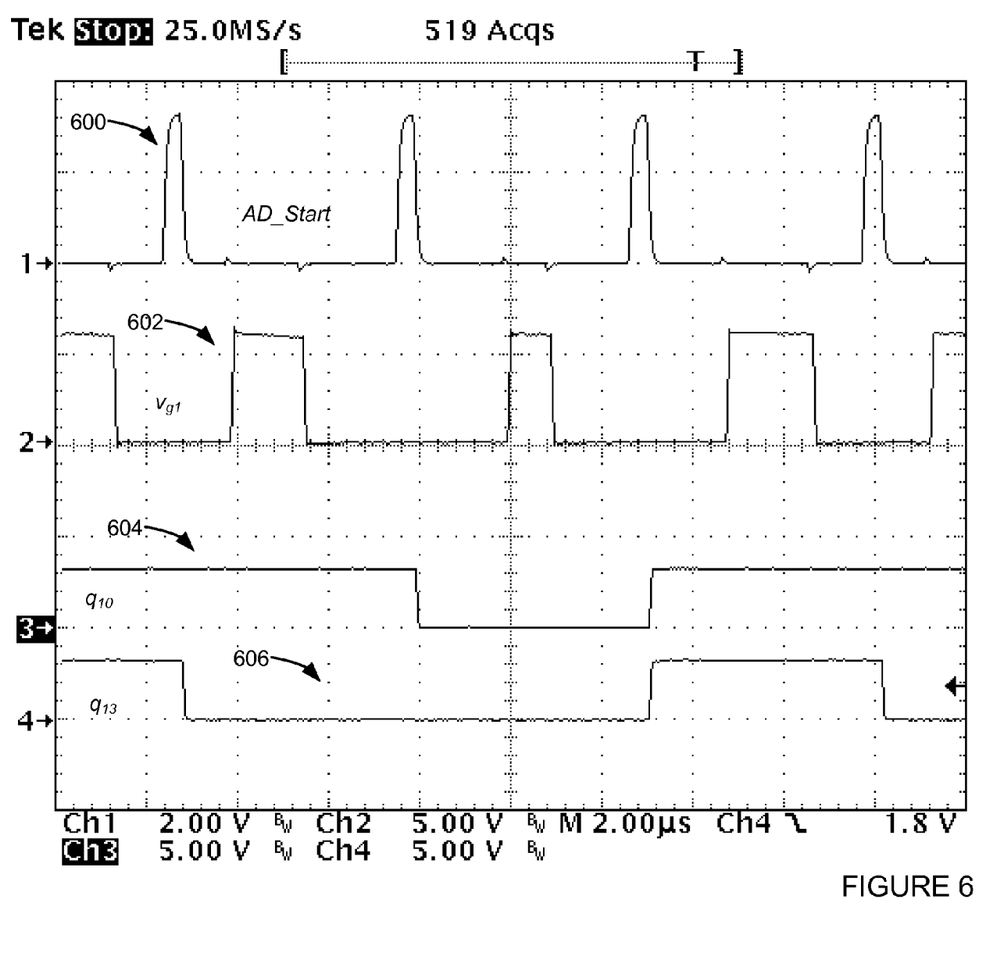
FIG. 6 shows dynamic operation of an experimental A/D converter sensing the inductor current with time-varying duty cycle values.

FIG. 6 shows dynamic operation of the experimental A/D converter sensing the inductor current with time-varying duty cycle values. In FIG. 6, a first waveform 600 comprises an AD_Start pulse shown in FIG. 3. A second waveform 602 comprises a gate drive voltage signal $v_{g1}$ for a main switch $Q_1$ of a DC-DC converter as shown in FIG. 1. A third waveform 604 and a fourth waveform 606 comprise a pair of outputs from the A/D converter shown in FIG. 3. Note how the AD_start signal is generated in the middle of the main switch off time, and how the digital outputs change values after the conversion time $T_c$ of approximately 400 ns (which corresponds to $R_{on}q_i$=4 mV and $V_{shift}$=1.7 V).

Advantages of the A/D converter include almost entirely digital-logic based design, relatively low power, small area and low sensitivity to noise. The design scales well with digital technology. For example, in 0.35μ CMOS, the conversion time for the LSB resolution of 5 mV is about 4 times shorter (about 60 ns) compared to the 0.8μ CMOS.

Digital Current Mode Control Architecture and Controller Realization

Figure 7:
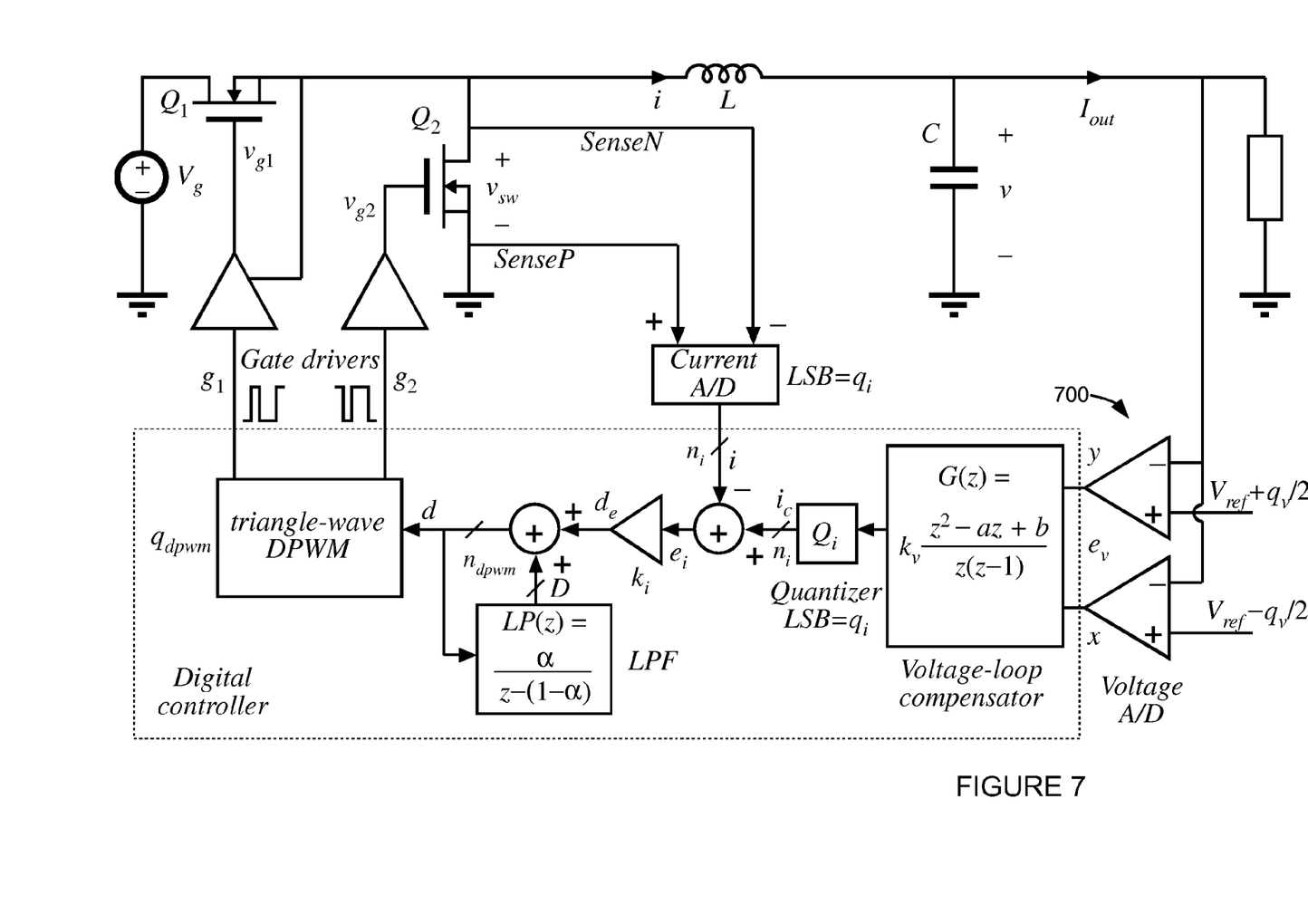
FIG. 7 shows one implementation of the digital current mode controller architecture of FIG. 1.

One possible realization of the digital current mode controller architecture of FIG. 1 is shown in FIG. 7. In this implementation, a windowed voltage A/D converter in which only a few bits $n_v$ to represent the digital error signal $e_v$ are needed for voltage sensing. FIG. 7 shows a windowed A/D converter 700 including a two-comparator flash converter. A voltage-loop compensator G(z), which can be a PID compensator (as shown in FIG. 7) or a PI compensator with proportional gain $k_v$, generates the current reference $i_c$. The current reference is quantized (simply by dropping bits) so that the LSB value $q_i$ of the current reference matches the LSB quantization of the current A/D converter. In an experimental prototype, $n_i$=4 bits is used to represent $i_c$ and i in the digital controller. To generate the duty-cycle command d, the current control law shown in formula (10) is then be implemented using a proportional gain $k_i$, and a moving-average low-pass filter, $$LP(z) = \frac{\alpha}{z-(1-\alpha)} \quad (12)$$

is used to estimate the steady-state duty cycle command D with high resolution. By choosing $\alpha$=$\frac{1}{2^p}$, the hardware implementation of the moving-average filter is very simple, requiring only shift and add operations. It is of interest to note that the moving-average filter shown in formula (12) results in a simple PI transfer function of the current-loop compensator $$G_i(z) = \frac{d}{e_i} = k_i \frac{z-(1-\alpha)}{z-1}. \quad (13)$$

The triangle-wave digital pulse-width modulator (DPWM), having the LSB value of $q_{dpwm}$=$\frac{1}{2^{ndpwm}}$, generates the gate-drive signals for $Q_1$ and $Q_2$ with the switch duty cycle determined by the duty-cycle command d.

Quantization and Limit Cycling Issues

Inherently, there are three quantizers in the controller: an A/D quantization of the voltage error signal, an A/D quantization of the inductor current, and a D/A quantization of the DPWM. In one embodiment of a controller architecture an additional quantizer of the current reference signal $i_c$ is also provided. It is well known that the quantization nonlinearity can cause undesirable disturbances, such as limit-cycling oscillations. In some embodiments, static and dynamic conditions may be used to eliminate limit cycling with the controller shown in FIG. 7.

A basic no-limit-cycle condition is related to the existence of the DC solution in the voltage regulation loop, $$q_{dpwm}V_g < q_v. \quad (14)$$

Provided that formula (14) is satisfied, a static no-limit-cycle condition in the architecture shown by FIG. 1 is guaranteed to exist with the moving-average filter described by formula (12), which generates the high-resolution steady-state duty cycle D.

In order to derive a dynamic no-limit-cycle condition, the current error signal $e_i$ shown in FIG. 7 can be observed. The current control law shown in formula (10) implies that the sampled inductor current follows the current reference with a one cycle delay. As a result, the current error $e_i$ is related to the change of the current reference $i_c$, which in turn is related to the operation of the voltage loop compensator. If limit cycling does occur, it can be assumed that the voltage error signal does not change by more than 1 LSB during one switching period. Under this assumption, the maximum change of $i_c$ is limited to $k_v q_v$, where $k_v$ is the proportional gain of the voltage-loop compensator shown in FIG. 7. Considering the quantization of both the inductor current and the current reference, the maximum amplitude of the current error (if limit cycling occurs) is the following:

$$\max(e_i)=Q_i(k_v q_v)+q_i, \quad (15)$$

where $Q_i(.)$ is the function of the quantizer with the LSB equal to $q_i$. In order to guarantee precise output voltage regulation, the controller may perform a corrective action whenever the output voltage is outside of the zero-error bin of the voltage A/D, whenever the $e_v \neq 0$. This implies that the voltage-loop compensator and the LSB values $q_v$ and $q_i$ satisfy the following condition:

$$k_v q_v > q_i. \quad (16)$$

The conditions of formulas (14) and (16) are a set of necessary no-limit-cycle conditions applied to design an experimental prototype.

Figure 8A:
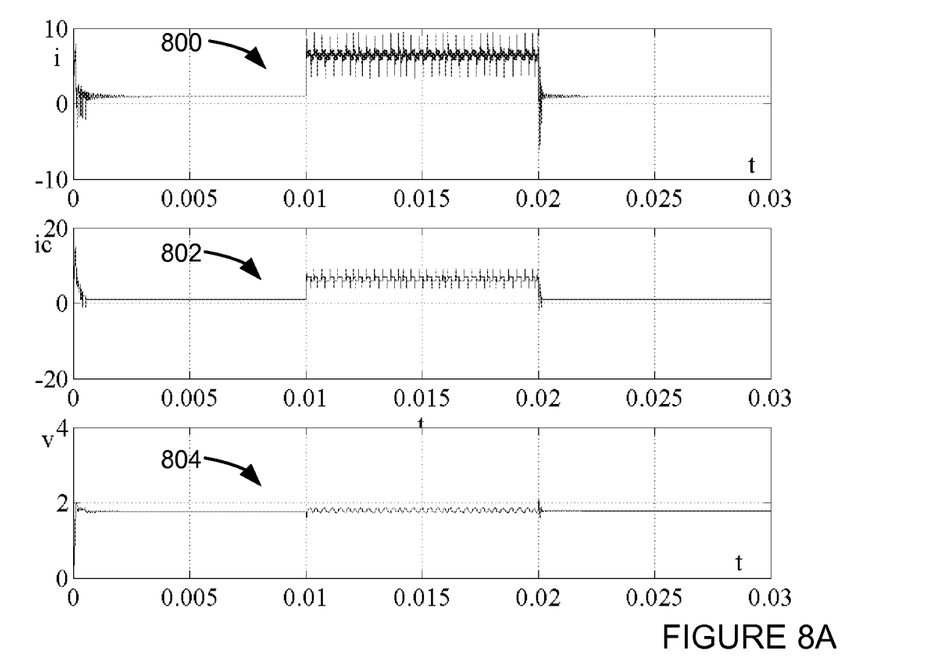
FIG. 8A shows waveforms illustrating an example of limit cycling occurring when a sensed load current is near a transition boundary of a current analog-to-digital converter.

When the load current is very close to a transition boundary of the current A/D converter, the current A/D converter may not give a stable output in steady state, resulting in limit cycling oscillations. As an example, a load transient response from 1 A to 6.5 A and then back to 1 A is shown in FIG. 8A. In this example, a first waveform 800 shows a sensed inductor current, a second waveform 802 shows a current reference, and a third waveform 804 shows an output voltage of a DC-DC converter.

In this example, parameters for a buck converter power stage are: L=0.9 µH, C=282 µF, a switching frequency of 200 kHz, an LSB of a current sampling A/D converter is $q_i$=1 A, a voltage sampling A/D converter is composed of two comparators with zero error bin of 125 mV. A voltage loop compensator is designed to provide the following transfer function:

$$G(z) = \frac{25z^2 - 28z + 8}{z(z-1)}. \quad (17)$$

The reason for the limit cycling at 6.5 A is that there is no steady state solution to this system, since this current is at a transition point of the current A/D converter. The A/D converter output flips back and forth between two adjacent digital codes, which introduces a disturbance to the system, resulting in limit-cycling waveforms. The output voltage may still stay inside the zero error bin, but since the load current is at the transition point of the current A/D converter, the current A/D converter will not give a constant output, which causes the disturbance. This phenomenon has been observed in experiments as well.

To address this problem, a small hysteresis or an offset may be added to the current A/D converter characteristic. In one implementation, for example, an offset of one half an LSB of the current sensing A/D converter may be added to the sensed current when limit cycling occurs under a certain load. For example, with an inductor current sensing using a differential delay-line A/D converter as described above, this can be done by adding an offset corresponding to one half LSB to the supply voltage for the reference delay line or the primary delay line.

The principle of a limit cycle elimination algorithm works as follow: if the output voltage stays inside the zero error bin for a certain number N of cycles (N can be 30 or 40, for example) and also in the current cycle, then the current cycle is considered a "no-oscillation cycle," otherwise it is considered an "oscillation cycle." A counter can be used to keep track of the number of "oscillation cycles." If the "oscillation cycles" count exceeds a certain threshold, the offset value can be switched from zero to one-half an LSB, or vice versa. The "oscillation cycles" counter can be reset by either a "no-oscillation cycle" or by switching off the offset value. The offset values are switched between 0 and half an LSB alternatively. Because there is an integrator in the voltage loop, without considering quantization problems, any offset error in the current A/D converter is absorbed by the voltage loop.

Figure 8B:
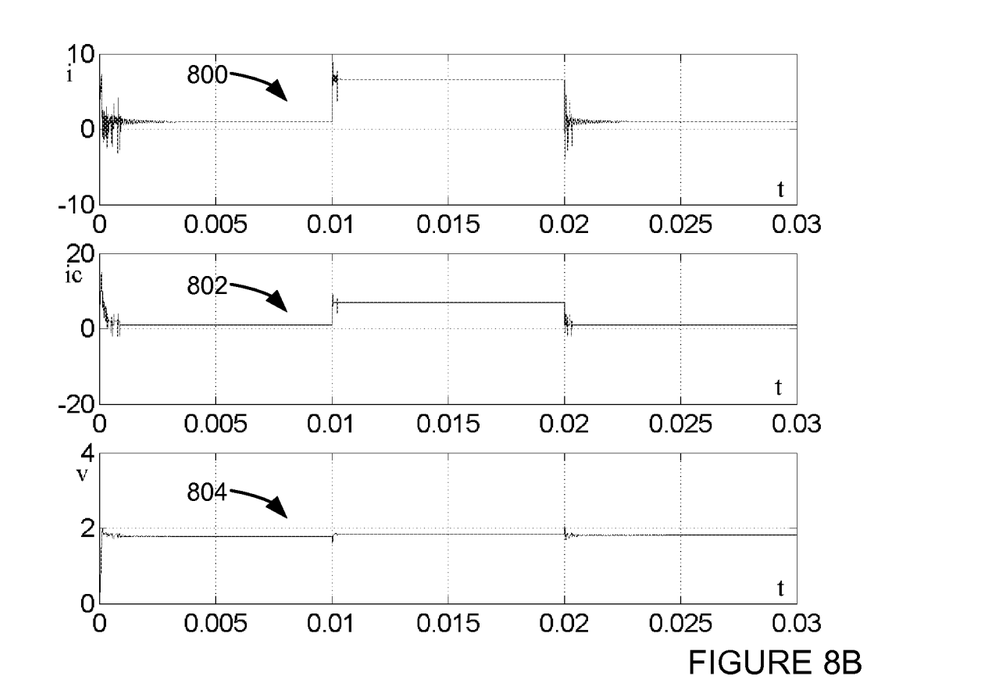
FIG. 8B shows waveforms illustrating one implementation of eliminating or reducing limit cycling shown in FIG. 8A.

FIG. 8B shows a simulation result for the same system and the same load transient when the technique discussed above is applied. In FIG. 8B, a first waveform 810 shows a sensed inductor current, a second waveform 812 shows a current reference, and a third waveform 814 shows an output voltage of a DC-DC converter. It can be observed that limit-cycling disturbances have been eliminated.

Current Loop and Voltage Loop Compensator

Determination of the proportional gain $k_i$ in the current loop ideally follows from formula (10), $$k_i = \frac{L}{V_g T}. \quad (18)$$

This ideally results in one-cycle dead-beat response. However, this design assumes that the values of T, L, and $V_g$ are known and constant. A value of $k_i$ larger than the actual value of $L/(V_g T)$ can compromise stability of the current loop. Therefore in some embodiments, $k_i$ should be selected according to expected tolerances in L, and for the maximum expected $V_g$. To design the voltage loop compensator, one can follow a standard direct-digital design approach based on the control-to-output transfer function $G_{vc}(z)$ in formula (II).

Inductor Current Protection

An important advantage of current-mode control is related to inductor over-load protection, including a current-limited response and the capability of automatic recovery from overload conditions. As in analog current mode control, the inductor current protection can be applied by limiting the maximum current reference $i_c$ to a reference value $I_{ref}$. When the converter is overloaded so that the current reference becomes constant ($i_c = I_{ref}$), the voltage-loop is open and the converter becomes a closed-loop current regulator with the PI current-loop compensator as shown in formula (13). The steady-state error in this current regulator is zero, and the output current equals $I_{ref}$.

In a transient from normal load to overload condition, the inductor current can exceed $I_{ref}$ for a short time interval. The worst-case overshoot in the inductor current during transient can be calculated from formula (10). The low-pass filter LP(z) gives the steady state duty cycle value D, which changes slowly through transients. If the output is short circuited abruptly, any positive duty cycle d increases the inductor current further. It follows that the maximum possible current overshoot $I_{max}$ corresponds to the duty cycle command d=0 in formula (10), which results in $$I_{max} = I_{ref} + \frac{D}{k_i}. \quad (19)$$

The time it takes for the current to return to the regulation, i=$I_{ref}$ depends on the design of the low-pass filter LP(z). A faster filter, i.e., a filter with larger α, results in shorter settling time, subject to no-limit-cycle and compensator design guidelines.

EXPERIMENTAL RESULTS

The experimental setup shown in FIG. 7 comprises an A/D prototype chip as described above as the current A/D converter, an FPGA implementation of the digital controller, and a 6-to-1.8 volt, 10 amp synchronous buck power stage operating at $f_s$=200 KHz. The power stage parameters are: L=0.9 µH, C=282 µF. The two-comparator voltage A/D converter has the zero-error bin width of $q_v$=125 mV. The current A/D converter has the LSB value of $q_i$=1 A (4-bit current A/D, $n_i=4$). The triangle-wave DPWM is a very simple counter-based design, which limits the resolution to 8 bits ($q_{DPWM}=1/256$).

Figure 9:
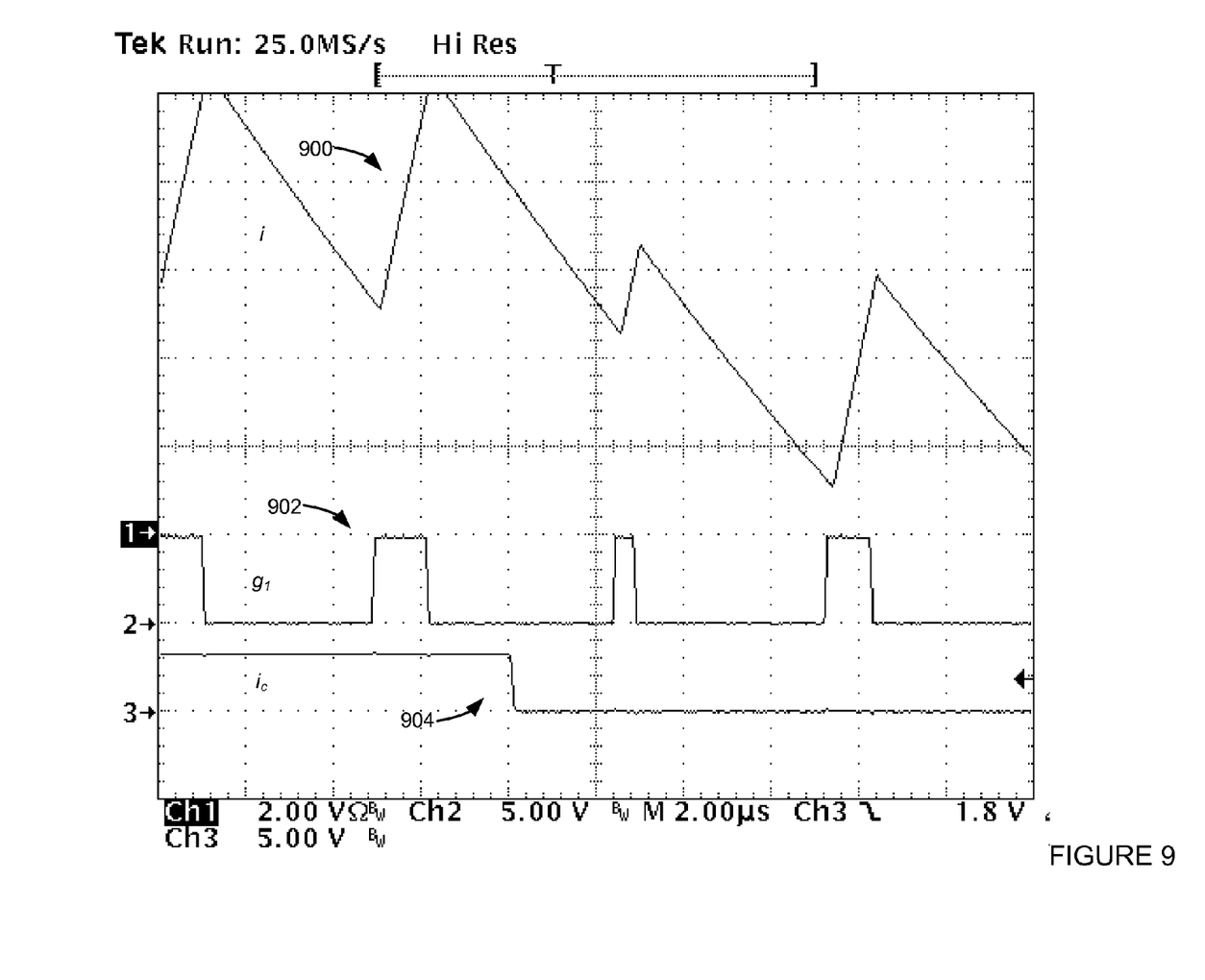
FIG. 9 shows one-cycle current response to a step change in the current reference.

FIG. 9 shows one-cycle current response to a step change in the current reference $i_c$. In FIG. 9, a first waveform 900 comprises an inductor current i of the DC-DC converter shown in FIG. 1. A second waveform 902 comprises a pulse-width modulated gate drive signal $g_1$ shown in FIG. 1. A third waveform 904 comprises a current reference signal $i_c$ also shown in FIG. 1.

Figure 10:
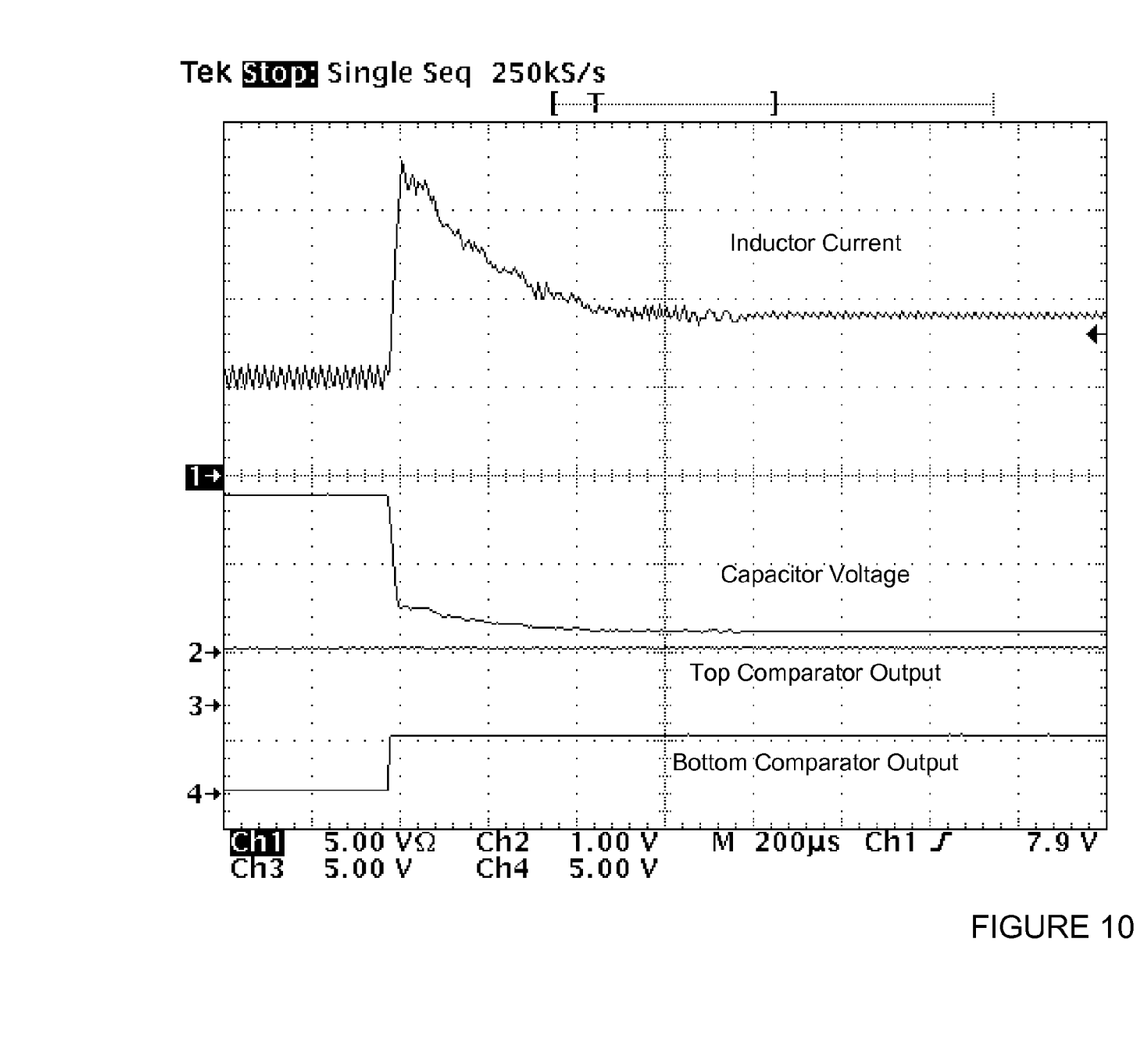
FIG. 10 shows a transient response to an abrupt short circuit on an output.

FIG. 10 shows a transient response to an abrupt short circuit on the output. The current reference is $I_{ref}=8$ A, and the steady-state current before the transient is about 5.5 A. The current overshoots to a value of approximately 18 A, as given by formula (19). The inductor current then returns to regulation ($I=I_{ref}$) within approximately 600 μs, which is determined by the response of the low-pass filter LP(z) in the current loop.

CONCLUSION

A digital current-mode control architecture based on a low-resolution current A/D converter and a simple digital controller realization is provided. This approach combines advantages of practical digital realization and current-mode control in DC-DC converters operating at high switching frequencies.

In a digital average current control loop, the sensed current tracks the current reference with a delay of only one switching cycle. An analysis of quantization effects in the voltage and the current loops leads to the control architecture where tight static and dynamic output voltage regulation can be accomplished without undesirable limit cycling. Design guidelines are provided for the resolution of the digital PWM, and the voltage and current A/D converters, as well as the design of the discrete-time current and voltage-loop compensators. The current-loop compensator includes a low-pass filter, which serves as a precise estimator of the steady-state switch duty cycle, and enables operation with low-resolutions of the current A/D and the current reference. As an example of practical current A/D realization, a differential delay-line configuration featuring nearly all-digital circuitry, small area, low power and insensitivity to noise is provided. The performance of the A/D converter has been verified experimentally on a prototype test chip designed in 0.8μ CMOS process.

In one particular implementation, a complete experimental system is constructed using a prototype current A/D converter chip, a current-mode digital controller implemented on an FPGA, and a 5 V-to-1.8 volt, 10 amp synchronous buck power stage operating at 200 KHz. Experimental results demonstrate one-cycle current tracking capability, load transient responses, and built-in over-current protection and the ability to sustain abrupt short-circuit conditions on the output.

Although embodiments of this invention have been described above with a certain degree of particularity, those skilled in the art could make numerous alterations to the disclosed embodiments without departing from the spirit or scope of this invention. All directional references (e.g., upper, lower, upward, downward, left, right, leftward, rightward, top, bottom, above, below, vertical, horizontal, clockwise, and counterclockwise) are only used for identification purposes to aid the reader's understanding of the present invention, and do not create limitations, particularly as to the position, orientation, or use of the invention. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other. It is intended that all matter contained in the above description or shown in the accompanying drawings shall be interpreted as illustrative only and not limiting. Changes in detail or structure may be made without departing from the spirit of the invention as defined in the appended claims.

What is claimed is:

1. A digital current-mode controller for a DC-DC converter, the controller comprising:
    a digital current reference; and
    a current loop compensator adapted to receive a digital current error signal derived from a digital current sample sensed from the DC-DC converter and the digital current reference and to generate a duty-cycle command,
    wherein the current loop compensator generates the duty-cycle command by adding a steady-state component of the duty-cycle generated by low-pass filtering the duty cycle command and a signal dependent on the digital current error signal.

2. A digital current-mode controller according to claim 1 wherein the digital current reference comprises a constant reference value.

3. A digital current-mode controller according to claim 1 wherein the digital current reference is generated by a voltage loop compensator adapted to receive a digital voltage error value.

4. A digital current-mode controller according to claim 3 further comprising a voltage A/D converter adapted to provide the digital voltage error value.

5. A digital current-mode controller according to claim 1 wherein the current loop compensator comprises a moving-average low-pass filter.

6. A digital current-mode controller according to claim 1 wherein the digital current sample tracks the digital current reference with a delay of one switching cycle.

7. A digital current-mode controller according to claim 1 wherein the duty cycle command comprises the following:

$$d[n]=k_i(i_c-i[n])+D,$$

in which $k_i$ is a current compensator gain, $i_c$ is the digital current reference, i[n] is the digital current sample, and D is the steady-state duty cycle command computed by low-pass filtering the duty cycle command d[n].

8. A digital current-mode controller according to claim 7 wherein the current compensator gain $k_i=L/(T_sV_g)$, in which L is an inductor value of the DC-DC converter, $V_g$ is an input voltage to the DC-DC converter, $T_s$ is a switching period of the DC-DC converter.

9. A digital current-mode controller according to claim 1 wherein the duty cycle command comprises a relatively larger resolution than the digital current sample.

10. A digital current-mode controller according to claim 1 further comprising a current analog-to-digital (A/D) converter adapted to provide the digital current sample.

11. A digital current-mode controller according to claim 10 wherein the current A/D converter comprises a differential delay line configuration.

12. A digital current-mode controller according to claim 1 further comprising a digital pulse-width-modulator adapted to provide a gate drive signal for a switch of a DC-DC converter in response to the duty-cycle command.

13. A switched-mode DC-DC regulator comprising:
    a switched-mode DC-DC converter comprising an input voltage terminal and an output voltage terminal, the switched-mode DC-DC converter comprising a switch;

a current analog-to-digital converter adapted to provide a digital sensed current value corresponding to an analog current value in the DC-DC converter;

a digital current reference; and a current loop compensator adapted to receive a digital current error signal derived from the digital sensed current value and the digital current reference, and to generate a duty-cycle command, wherein the current loop compensator generates the duty-cycle command by adding (i) a steady-state component of the duty-cycle generated by low-pass filtering the duty cycle command and (ii) a signal dependent on the digital current error signal.

14. A switched-mode DC-DC regulator according to claim 13 further comprising:

a voltage analog-to-digital converter adapted to provide a digital voltage error signal based upon an output voltage of the switched-mode DC-DC voltage regulator; and a voltage loop compensator adapted to determine the digital current reference based upon the digital voltage error signal.

15. A switched-mode DC-DC regulator according to claim 14 wherein the voltage analog-to-digital converter is adapted to sense an analog voltage of the switched-mode DC-DC converter, compare the sensed voltage to a reference voltage, and provide the digital voltage error signal.

16. A switched-mode DC-DC regulator according to claim 13 further comprising a digital pulse-width-modulator adapted to provide a pulse-width-modulated control signal to control the operation of the switch of the switched-mode DC-DC converter.

17. A switched-mode DC-DC regulator according to claim 13 wherein the switched-mode DC-DC converter comprises a buck converter.

18. A switched-mode DC-DC regulator according to claim 13 wherein the current analog-to-digital converter comprises an offset.

19. A switched-mode DC-DC regulator according to claim 18 wherein the offset comprises one-half of a least significant bit of the digital sensed current value.

20. A switched-mode DC-DC regulator according to claim 18 wherein the offset is added to the digital sensed current value where an oscillation cycle exceeds a predetermined threshold and no offset is added where the oscillation cycle does not exceed the predetermined threshold.

21. A method of generating a duty-cycle command for a DC-DC converter, the method comprising:

receiving a digital current reference;

receiving a digital current sample sensed from the DC-DC converter;

generating a digital current error signal derived from the digital current reference and the digital current sample; and providing a current compensator to generate a duty-cycle command by adding (i) a steady-state component of the duty-cycle command generated by low-pass filtering the duty cycle command and (ii) a signal dependent on the digital current error signal.

22. A method according to claim 21 wherein the low-pass filter comprises a moving-average low-pass filter.

* * * * *